(12) United States Patent
Olieman et al.

(10) Patent No.: US 11,791,832 B2
(45) Date of Patent: Oct. 17, 2023

(54) TIMING CALIBRATION TECHNIQUE FOR RADIO FREQUENCY DIGITAL-TO-ANALOG CONVERTER

(71) Applicant: NXP B.V., Eindhoven (NL)

(72) Inventors: Erik Olieman, Waalre (NL); Rene Verlinden, Geldern (DE); Helmut Kranabenter, Graz (AT)

(73) Assignee: NXP B.V., Eindhoven (NL)

( * ) Notice: Subject to any disclaimer, the term of this patent is extended or adjusted under 35 U.S.C. 154(b) by 55 days.

(21) Appl. No.: 17/577,501

(22) Filed: Jan. 18, 2022

(65) Prior Publication Data

US 2023/0231566 A1 Jul. 20, 2023

(51) Int. Cl.
H03M 1/10 (2006.01)

(52) U.S. Cl.
CPC ................... *H03M 1/1014* (2013.01)

(58) Field of Classification Search
CPC ........ H03M 1/662; H03M 1/66; H03M 1/742; H03M 1/747; H03M 1/0863; H03M 1/0624; H03M 1/745; H03M 1/0836; H03M 1/0614; H03M 1/1009; H03M 1/68; H03F 3/2175; H03F 1/0205; H03F 3/24; H03F 1/02; H03F 1/0288; H03F 1/30; H03F 1/3247; H03F 3/45179; H03F 3/189; H03F 2203/7215
USPC ................... 341/118–120, 141, 144
See application file for complete search history.

(56) References Cited

U.S. PATENT DOCUMENTS

| | | | |
|---|---|---|---|
| 7,042,379 B2 * | 5/2006 | Choe .................. | H03M 1/0881 341/144 |
| 7,941,686 B2 * | 5/2011 | Fujisawa .................. | H03L 7/00 713/320 |
| 8,520,968 B1 * | 8/2013 | Wyville .................. | G06F 18/00 382/300 |
| 9,071,196 B2 * | 6/2015 | Huang .................. | H03D 7/1441 |
| 9,178,524 B1 * | 11/2015 | Lee ...................... | H03M 1/0881 |
| 9,385,742 B1 * | 7/2016 | Cheng .................. | H03M 1/742 |
| 9,564,913 B1 * | 2/2017 | Courcy ................. | H03L 7/0891 |

(Continued)

FOREIGN PATENT DOCUMENTS

WO    WO-2021206597 A1 * 10/2021

OTHER PUBLICATIONS

Luschas et al., "Radio Frequency Digital-to-Analog Converter," IEEE Journal of Solid-State Circuits, vol. 39, No. 9, Sep. 2004, pp. 1462-1467; 6 pages.

(Continued)

*Primary Examiner* — Linh V Nguyen

(57) ABSTRACT

A calibration system comprises an actuator circuit comprising a first delay circuit that receives a plurality of data pulses and a second delay circuit that receives the pulses, wherein one of the first and second delay circuits delays the data pulses independently of the other of the first and second delay circuits; a data switch that receives an output of the actuator circuit including delay data signals of the data pulses from the first and second delay circuits and switches and outputs a plurality of local oscillator (LO) signals for output as a controlled LO signal according to control signals of the delay data signals and applied to the data switch. At least one calibration switch receives the output of the actuator circuit and the plurality of LO+ and LO− signals, and outputs a second controlled LO signal output to a sense circuit.

15 Claims, 7 Drawing Sheets

(56) References Cited

U.S. PATENT DOCUMENTS

| | | | |
|---|---|---|---|
| 9,584,151 B1 * | 2/2017 | Manganaro | H03M 1/0863 |
| 9,705,522 B1 * | 7/2017 | Ng | H03M 1/662 |
| 2005/0190854 A1 * | 9/2005 | Shakeshaft | H03M 1/745 |
| | | | 375/295 |
| 2005/0191976 A1 | 9/2005 | Shakeshaft et al. | |
| 2019/0207616 A1 * | 7/2019 | Chen | H03M 1/1014 |
| 2019/0383924 A1 * | 12/2019 | Mehdizad Taleie | G01S 7/006 |
| 2022/0239303 A1 * | 7/2022 | Wong | H03M 1/747 |

OTHER PUBLICATIONS

Duncan et al: "A 10-bit DC-20-GHz Multiple-Return-to-Zero DAC With >48-d.B SFDR", IEEE Journal of Solid-State Circuits, IEEE, USA, vol. 52, No. 12, Nov. 10, 2017 (Nov. 10, 2017), pp. 3262-3275.

Chou et al: "A low-glitch binary-weighted DAC with delay compensation scheme", Analog Integrated Circuits and Signal Processing, Springer New York LLC, US, vol. 79, No. 2, Feb. 5, 2014 (Feb. 5, 2014), pp. 277-289.

* cited by examiner

TIMING CALIBRATION TECHNIQUE FOR RADIO FREQUENCY DIGITAL-TO-ANALOG CONVERTER

FIELD

The present disclosure relates generally to mobile communications, and more specifically, to a Radio Frequency Digital-to-Analog Converter (RF-DAC) that reduces, avoids, or prevents undesirable glitches between a Local Oscillator (LO) and data clock.

BACKGROUND

A mixing RF-DAC operates by toggling a Local Oscillator (LO) signal based on a data input signal. During operation, a desired spectral purity may be impacted by imperfections in the RF-DAC such as nonlinearities, or data-dependent glitches at the output due to the timing relationship between clocks corresponding to the LO and data signals, respectively. If the data clock and LO clock frequencies are in an integer ratio then, depending on their phase relationship, glitches can be generated at every data transition which degrade linearity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

To achieve the foregoing, it is desirable to provide a separate timing calibration for the data switching of the positive and the negative LO signal.

Figure 1:
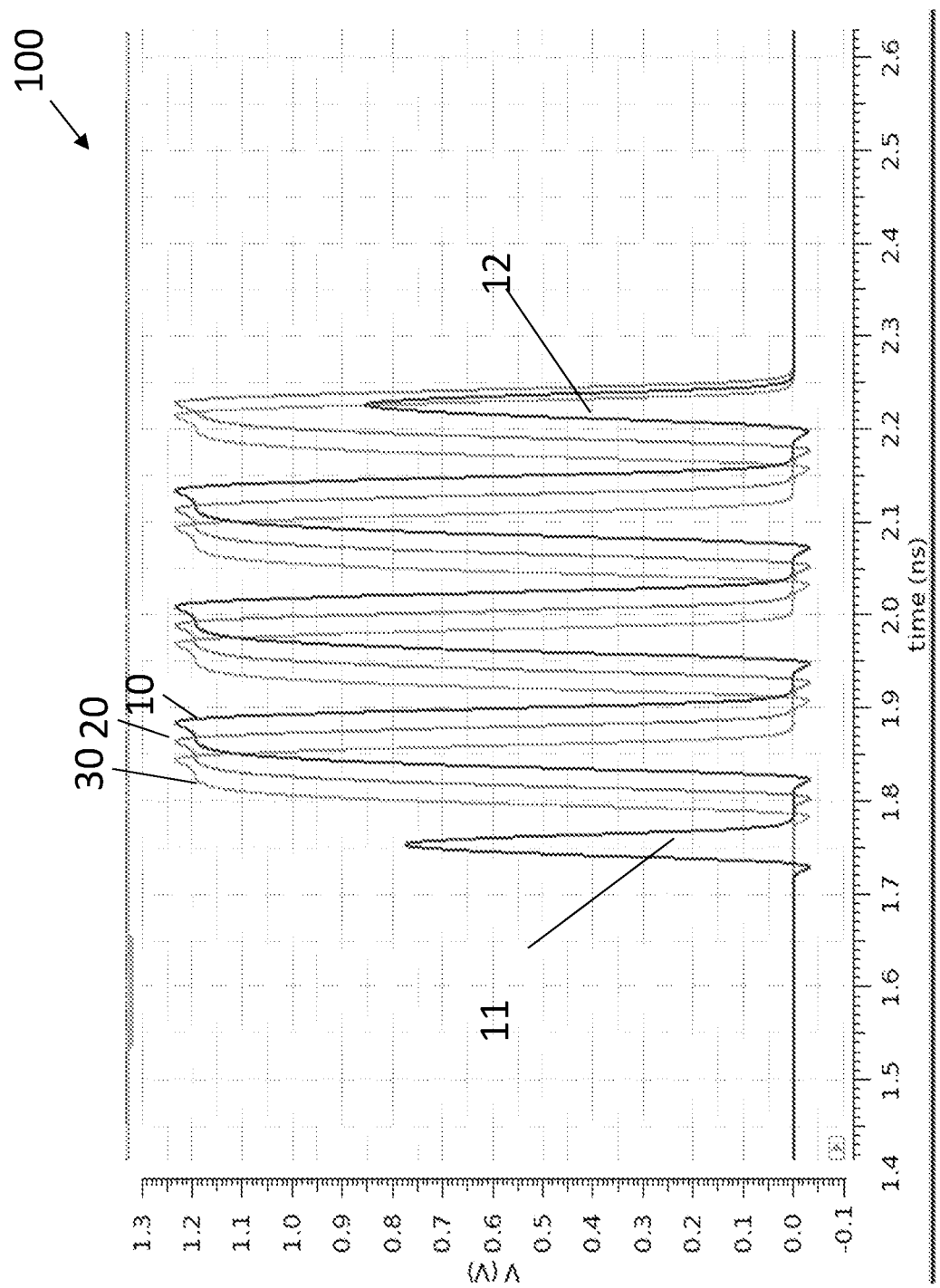
FIG. 1 is a graph illustrating three output voltage waveforms for three different phase relations between a LO and a data clock.

Referring to FIG. 1, shown is a graph 100 illustrating a signal having three possible output voltage waveforms for three different phase relations between a LO and a data clock. In this example, one data period comprises four LO cycles, so the integer ratio between data clock frequency and LO frequency is four. The data signal switches to a high level ("1") during a single data period. Depending on the phase of the data clock relative to the LO, the output waveform might contain glitches. The waveform 10 shows three full LO cycles and two glitches 11, 12 instead a desirable four full LO cycles. On the other hand, the other waveforms 20, 30 illustrate complete pulses corresponding to desirable behavior of an RF-DAC. Generally, if the LO frequency is an integer multiple of the data clock frequency and if the LO and data clock phase alignment is such that data clock edges occur during the high state of the LO clock glitches such as those shown in FIG. 1 may be produced. This corresponds to nonlinear behavior and reduces the spectral performance of the RF-DAC.

In brief overview, embodiments of the present inventive concept include a timing calibration system and method that prevent glitches shown in FIG. 1 from occurring, in particular, in a differential mixing RFDAC where a data input signal enables or disables LO+ and LO− signals. This can be achieved by the system and method determining proper data signal delays, for example, such that the data only switches when the LO is in a low state. However, since RF-DACs may use differential LO signals, if one phase is low then the other is high. This is solved by using different delays for the data, depending on whether the LO+ or LO− is switched. The calibration system and method use separate timing calibration for the data switching the positive and negative LO signal to prevent glitches without complex circuitry or configuration that would otherwise be required to provide an accurate calibration operation.

Figure 2:
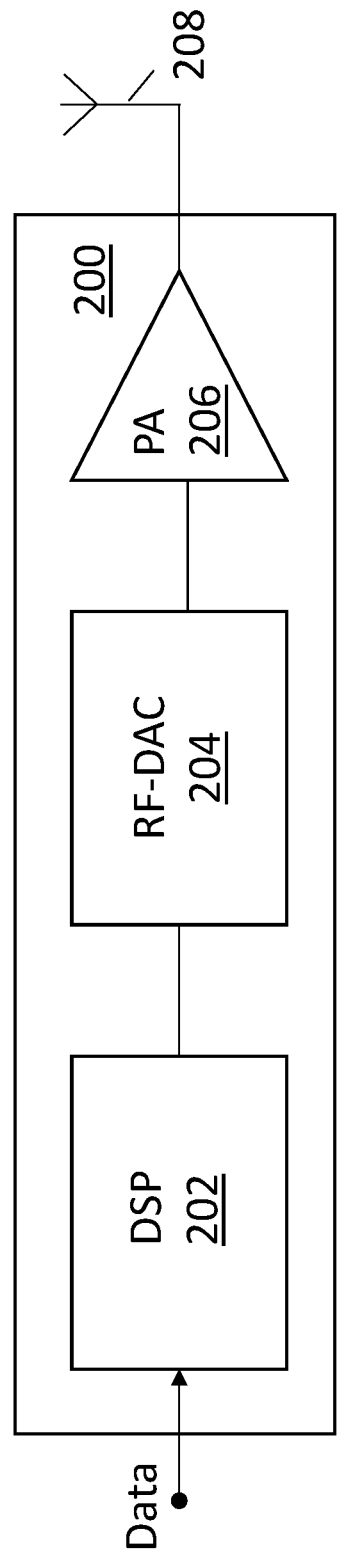
FIG. 2 is a block diagram of mobile communication device in which embodiments of the present inventive concept can be practiced.

FIG. 2 is a block diagram of mobile communication device 200 in which embodiments of the present inventive concept can be practiced. The mobile communication device 200 can be a smartphone, personal computer, network base station, key fob, or generally an electronic device that wirelessly exchanges electromagnetic signals via the antenna of another wireless device. As shown, the mobile communication device 200 can include one or more digital baseband processors 202, RF-DACs 204, Power Amplifiers (PA) 206, and antennas 208. A baseband processor 202 may generate signals for transmission via the antenna 208.

A baseband processor 202 performs data coding, filtering, and/or related processing operations on input data for an RF-DAC 204 for conversion to the analog domain. An RF-DAC 204 may be followed by and provide a signal output to one or more PA circuits 206 for delivering the signals with the required power to an antenna 208. The RF-DAC 204 may include a separate timing calibration circuit, for example, shown in FIGS. 3 and 5 to perform data switching of the positive and negative LO signals in order to prevent glitches from occurring.

Figure 3:
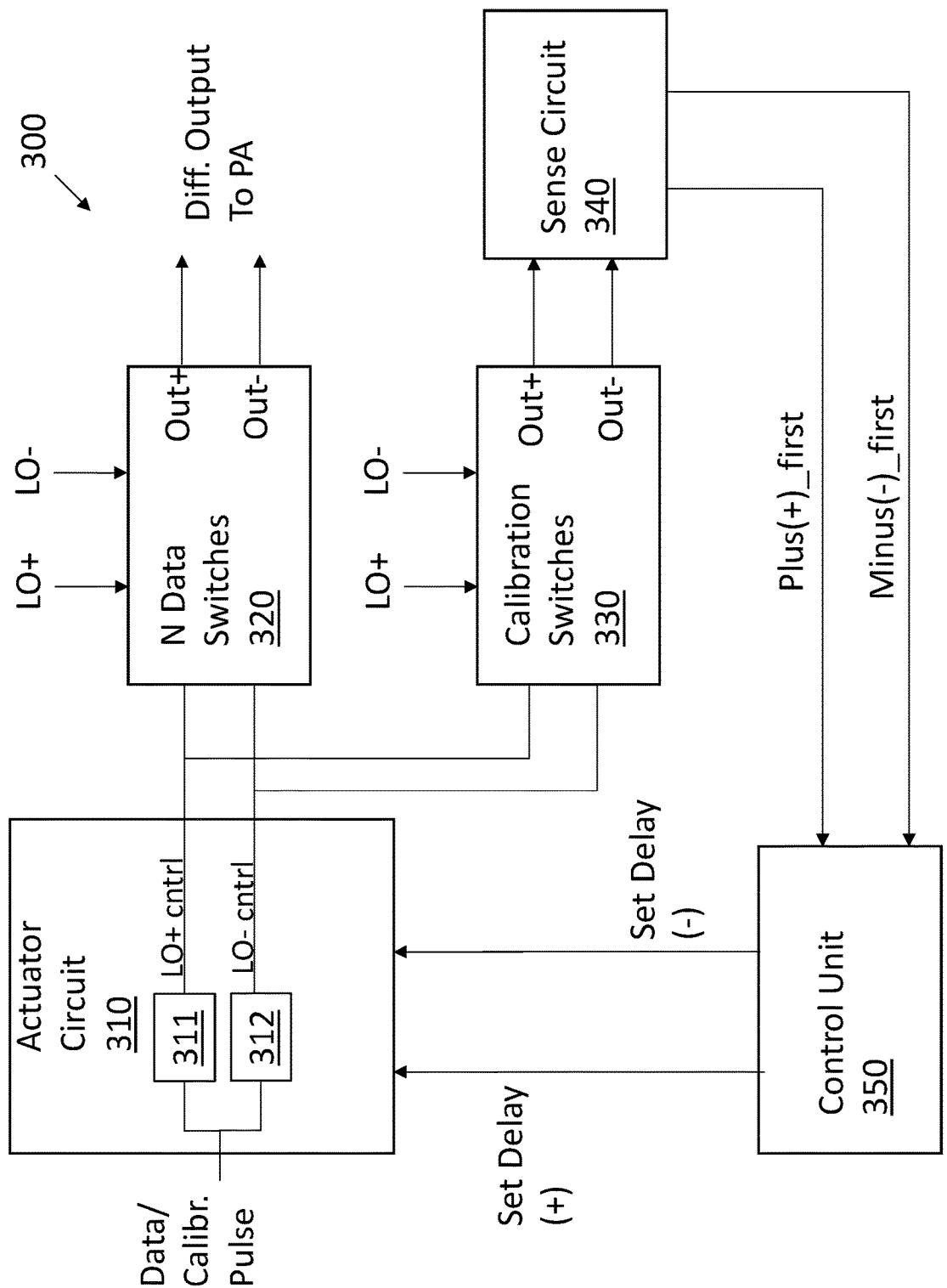
FIG. 3 is a block diagram of an RF-DAC circuit for a transmitter, in accordance with some embodiments.

In particular, with reference to a calibration system 300 shown in FIG. 3, data signals can be delayed by the actuator circuit 310 such that transitions occur when the corresponding LO signal is in a low state. A basic property of the LO signals of a differential RFDAC is that if one phase is in a low state, the other signal of the differential pair is in a high state. This can be addressed by using different delays for the data depending on whether the LO+ or LO− signal inputs and/or which signal input of the phase shifted LO pair is switched. As shown in FIG. 3, a calibration switch 330 is in parallel with a data switch 320 so that each receives the LO+/LO− signal inputs, and permits the calibration loop (330, 340, 350) to change the data delay and remove undesirable glitches by means of the actuator circuit 310. In some embodiments, the calibration switch 330 may be a replica of, or similar to, the data switch 320. This allows calibration without generating a signal at the output by disabling the data switch and enabling the calibration switch 330. The calibration switch output signal is fed to a sense circuit 340. For calibration purposes, single data pulses are created on demand by a control unit 350. The sense circuit 340 then senses the delays, namely, detecting if a LO+ signal or a LO− signal occurred first. If the LO+ signal is received first, then the LO+ signal can be delayed by a half period or cycle. Depending on this information the control unit 350 adapts the data delay, i.e., output as a set delay (+) or set delay (−) signal to the actuator circuit 310, such that no glitch occurs on either out+ or out− differential outputs of the calibration switch(es) 330 coupled to the sense circuit 340 and therefore also not at the differential output to the PA at the differential output of the data switch(es) 320. In some embodiments, the set delay (+) signal generated by the control unit 350 can control the delay produced by the LO+ delay circuit 311 of the actuator 310 and the set delay (−) signal can control the delay produced by the LO− delay circuit 312.

A transmitter to which the RF-DAC calibration system 300 corresponds may be for a wireless transmission apparatus. In some embodiments, the RF-DAC calibration system 300 may be part of the RF-DAC 204 of FIG. 2. In some embodiments, the RF-DAC calibration system 300 may be implemented in related applications such as Ultra-Wideband (UWB) technology or the like, for example, implemented in automobile applications but not limited thereto. In some embodiments, one or more RF-DAC circuits including a calibration system 300 may be implemented as Integrated Circuits (ICs) on a computer chip. In some embodiments, one or more RF-DAC circuits 300 may be constructed and arranged for integration as a System-on-Chip (SoC) or the like. In some embodiments, the RF-DAC circuit may integrate the function of a RF mixer circuit and a DAC into a single circuit.

The RF-DAC calibration system 300 includes an actuator circuit 310, a data switch 320, a calibration switch 330, a sense circuit 340, and a control unit. The RF-DAC calibration system 300 may include other active and/or passive electrical components that are not described herein due to brevity and are not required to describe the embodiments of the inventive concept. The RF-DAC calibration system 300 may correspond to at least one RF-DAC cell of a cell array.

The actuator circuit 310 is constructed and arranged to receive and input a plurality of data pulses to a first LO (LO+) delay circuit 311 and a second LO (LO−) delay circuit 312. The LO+ and LO− delay circuits 311, 312 delay the data pulses independently. All data pulses received by the LO+ delay circuit 311 have the same delay. Similarly, all data pulses received by the LO− delay circuit 312 have the same delay. The data switch 320 and calibration switch 330 each receives the same output, i.e., delayed data signals from the LO+ and LO− delay circuits 311, 312, respectively. However, both the data switch 320 and calibration switch 330 can process LO+ and LO− signals having different delays.

In some embodiments, the data switch 320 and calibration switch 330 can be constructed and arranged to communicate with a local oscillator, and has two inputs for receiving a different pair, i.e., LO+ and LO− signals, respectfully. The data switch 320 may include a plurality of N data switches, where N is the number of unit cells. For example, a 6-bit RF-DAC may have 63 unit cells and can therefore output 64 different values (0-63 unit cells enabled). The data switch (es) 320 receive the (delayed) data signals, and control the LO+ and LO− signals also received by the data switch(es) 320. In particular, the data switch 320 enables or disables the LO+/LO− signals to produce waveforms, for example, shown in FIG. 7. In particular, the timing can vary between the integer clocks of the LO+ and LO− control signals to provide output pulses with no glitches and thereby improving linearity. The calibration procedure is robust in that minor timing variations or calibration errors have no impact on performance of the circuit as long as always complete pulses are put out. Here, the output of the data switch 320 can be output to a PA stage, for example, PA circuit 206 shown in FIG. 2.

The calibration switch 330 can receive the same (delayed) data signals from the actuator circuit 310, except that the calibration switch 330 provides the output to a sense circuit 340 which can determine whether an LO+ or LO− signal is received first, and used to check for glitches or other related undesirable features. It is well-known that a RF-DAC cell can operate as a DAC driver circuit, and in doing so may receive complementary multi-bit digital signals, which are driven by the data clock. The RF-DAC cell in response toggles the LO signals based on the (delayed) data input. The sense circuit 340 receiving the output of the calibration circuit 330 can measure the timing relationship between a differential LO signal with a data signal using at least one of an array of unit cells. More specifically, the sense circuit 340 checks if LO+ or LO− is first at the output of the calibration switch 330.

Figure 4:
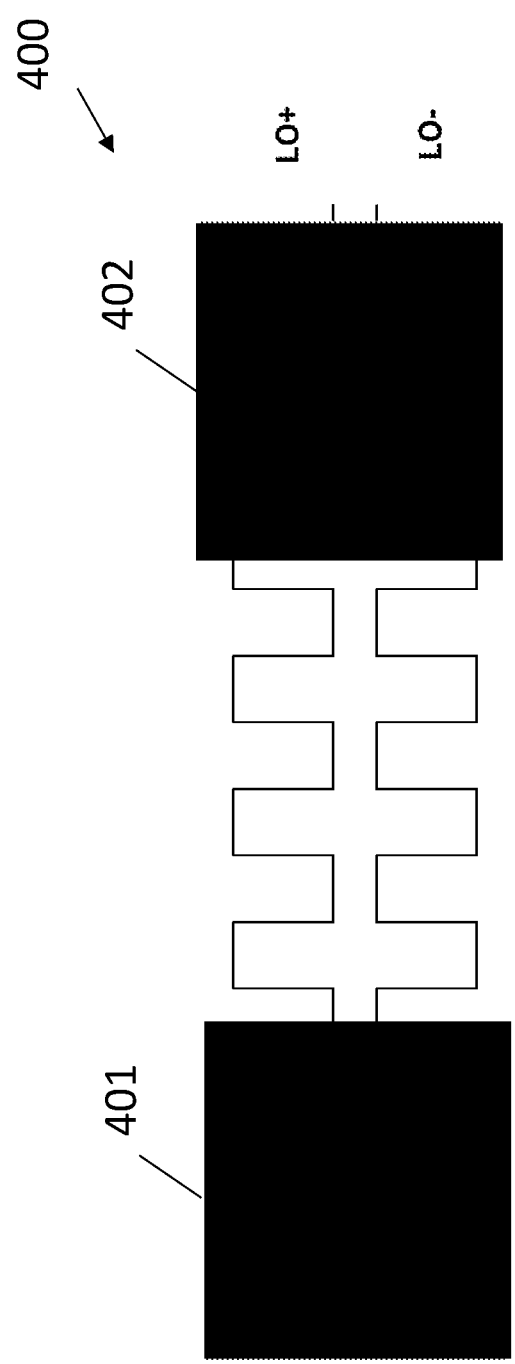
FIG. 4 is an illustration of a differential voltage waveform, in accordance with some embodiments.

As shown in FIG. 4, a differential signal waveform illustrates a simplified RF-DAC pulse 400 arranged as a differential pair, in particular, LO+ and LO− signals. As the LO signals are inputs to the RF-DAC, they are processed, or generated, by an RF-DAC cell. In this example, the first and last pulse of the LO+ signal has glitches 11, 12 shown in FIG. 1, while the LO− pulse stream includes no glitches or related undesirable features. The resulting modified pulse 400 shown in FIG. 4, i.e., is output to the PA stage. Depending on a data signal the differential output voltage waveform is following LO+ and LO−, as shown in the portion in the center, or it is at zero output level which is indicated here by the covered portions 401 and 402. The differential output waveform consists of 4 complete LO− pulses for the negative output but only 3 complete LO+ pulses and two half pulses, respectively glitches, at the beginning and at the end, which can cause reduced linearity of the RFDAC.

Here, the LO+ and LO− control signals are in phase. The RF-DAC calibration system 300 can delay one of the LO+ and LO− control signals relative to the other of the LO+ and LO− control signals, for example, shown in FIG. 7, where the LO+ and LO− control signals may be output from and delayed accordingly by the delay circuits 311, 312, respectively. For example, the actuator circuit 310 acts on the data so that the LO− control signal is not delayed while the LO+ control signal is delayed by a half period or cycle such that data transition occurs during the low phase of the LO+ signal. The control signals output from the actuator circuit 310 can therefore determine whether an LO is output to the PA output (Out+, Out−). Accordingly, unlike FIG. 4, both the LO+ and LO− signals shown in FIG. 7 have four proper pulses at the output with no glitches, thereby improving linearity.

Figure 5:
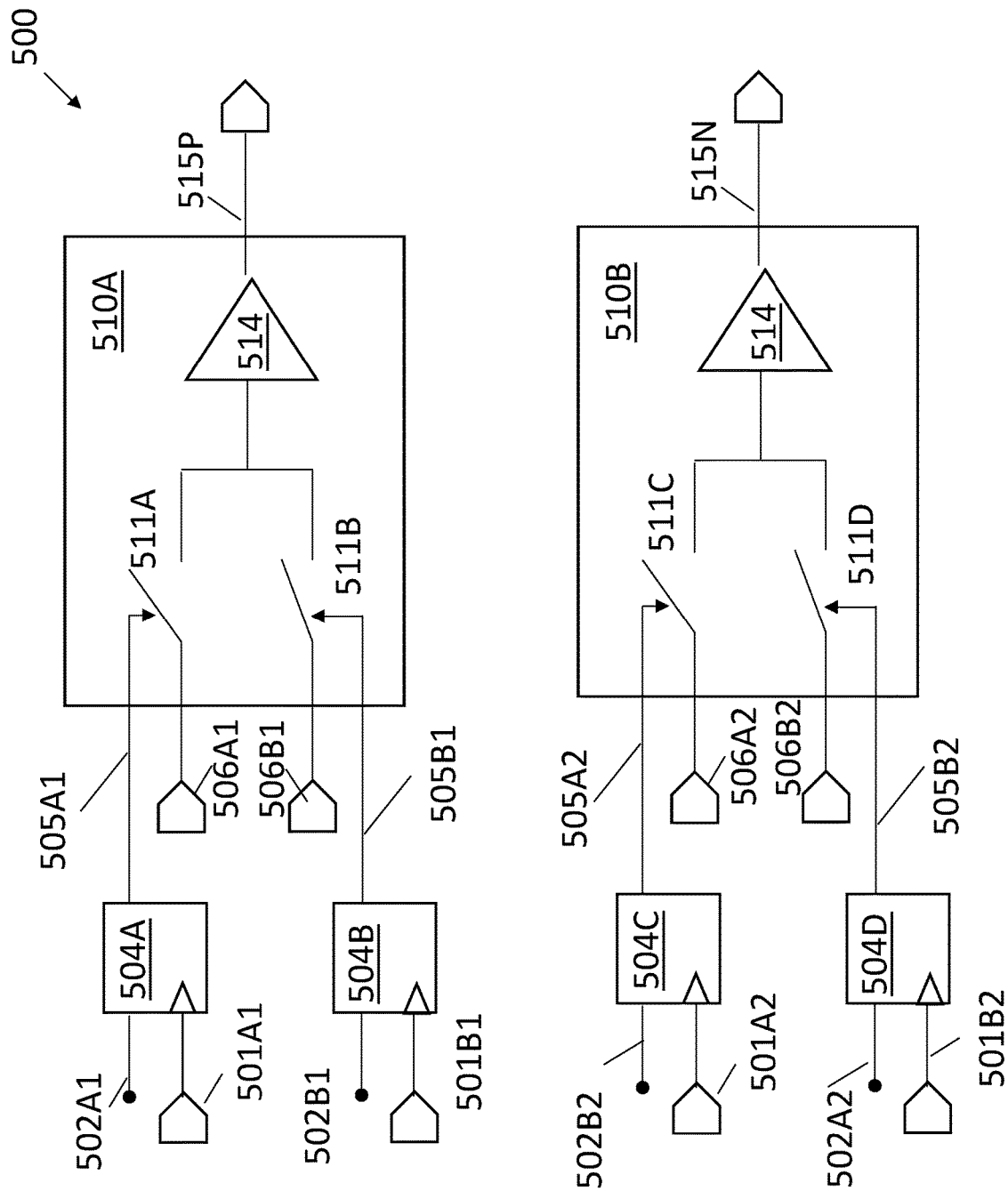
FIG. 5 is a schematic representation of a unit cell of a RF-DAC circuit, in accordance with some embodiments.
Figure 7:
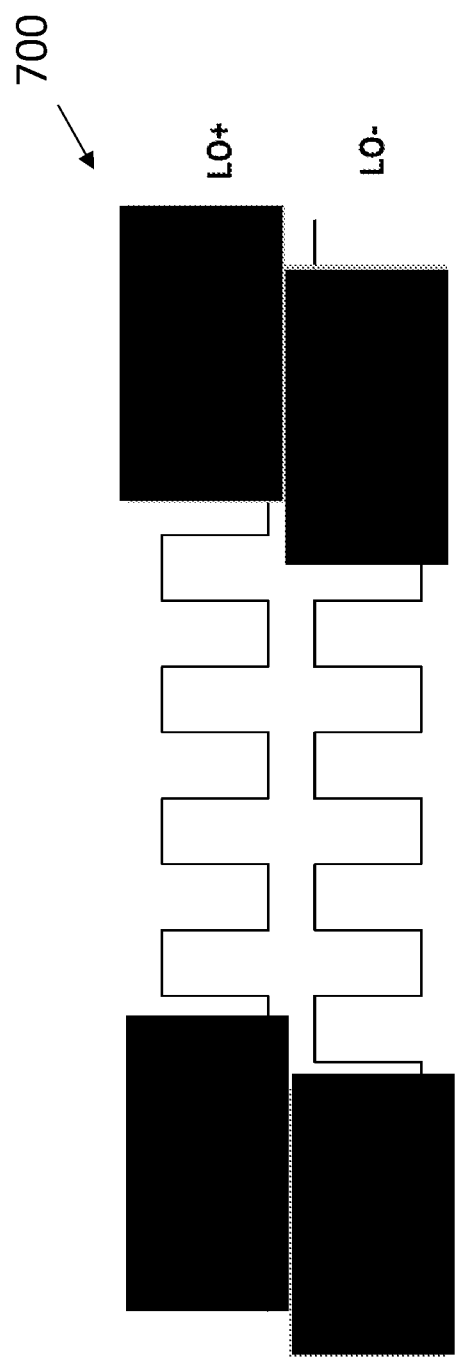
FIG. 7 is an illustration of a differential signal waveform illustrating delayed control signals after a successful delay calibration.

FIG. 5 is a schematic representation of a unit cell 500 of a RF-DAC circuit, in accordance with some embodiments. In some embodiments, elements of the unit cell 500 may be part of the calibration system 300 of FIG. 3. For example, latches 504A, B of one or more latch circuits may be part of the actuator circuit 310 and switches 511A-511D (generally, 511) may be part of the switch circuit 320, 330. For example, the unit cell 500 can act on the RF-DAC pulse 400 of FIG. 4 so that it is output as shown in FIG. 7. The latches 504 can delay the signals 502, where clock signal 501A is such that latch output connector 505A will only have an edge, either rising or falling when signal 506A is low. Similarly, clock signal 501B is timed such that latch output connector 505B will only have an edge when signal 506B is low. This guarantees that the only full cycles from signal 506 end up at the output 515. The manner in which the delay circuit formed of first and second latch circuits, or latches 504A-504D (generally, 504) of the actuator system 310 acts on the received measurement data may depend on the RF-DAC architecture. A complete RF-DAC may include an array of the unit cells 500.

The latches 504A-504D (generally, 504) of the RF-DAC unit cell 500 in front of switch circuits 510A, 510B, respectively, are constructed and arranged to either directly pass a control signal or delay it, by for example, by a half period of an LO signal. As shown in FIG. 5, the RF-DAC unit cell 500 can include a first circuit, e.g., 311 of FIG. 3, having the first and second latches 504A and 504B that delay when the LO+ signal is enabled signals 506A1, B1 and a second circuit, e.g., 312 of FIG. 3, having first and second latches 504C and 504D that can delay when the LO− signal is enabled 506A2, B2. The latches 504 may be D-latches or the like, but not limited thereto. The switch circuit 510A of the first circuit controls, i.e., enables or disables, the output of the LO+ signal at the output 515P of the unit cell 500 according to the (delayed) data signal. Similarly, the switch circuit 510B of the second circuit controls the output of the LO− signal at the output 515N of the unit cell 500. The switch circuits 510A, B are constructed and arranged to control the LO+ and LO− signals so that if one output is output of the LO+ and LO− signals so that if one is disabled then the other is also disabled within a half period, etc. To achieve this, switch circuit 510A, 510B may include a switch 511 and a buffering circuit 514 or the like providing a differential output 515P, N, respectively.

In order to generate the timing of the LO+ and LO− signals, referring again to FIG. 7, the latches 504B and 504D and corresponding connectors 505B1 and 505B2 responsible for enabling or disabling the LO− signal by controlling switches 511 may be in a transparent mode and take no action. e.g., do not delay the propagation of the LO− signal.

More specifically, the second latch 504B of the first circuit includes a data input 502B1 and a clock input 501B1. The data input 502B1 receives a signal which is intended to turn on, or activate, switch 511B. The clock input 501B1 may receive a signal that delays the propagation from clock input 501B to latch output connector 505B, which in turn delays switch 511B from toggling its state. The clock input 501B1 may also receive a signal that keeps the latch transparent, resulting in latch output connector 505B being equal to data input 502B.

The second latch 504D of the second circuit includes a data input 502A2 and a clock input 501B2. However, the data input 502A2 of the second latch 504D is configured to receive a positive differential data signal, while the clock input 501B2 receives the clock signal also received by the clock input 501B1 of the second latch 504B of the first circuit. Accordingly, in some embodiments, the data input 502A1 and 502A2 may be positive in which case the data inputs 502B1 and 502B2 have zero values, and vice versa, and in other embodiments, when data inputs 502A and 502B have zero values, then the output is zero. Accordingly, the second latch 504D of the second circuit is inactivated, which in turn prevents an output from the second latch 504D from enabling the second switch 511D of the second switch circuit 510B. The output 515N therefore does not output a LO signal 506.

On the other hand, the first latches 504A and 504C and corresponding connectors 505A1 and 505A2 control the LO+ signal to output by means of a (delayed) clock 501 which may delay the data signal at the output 515P of the first circuit by a half cycle of an LO period. In particular, the first switch 511A of the first switch circuit 510A is activated or closed in response to receiving a signal from the latch output connector 505A1 of the first latch 504A, noting that the second switch 511B is closed as described above. In doing, so the data signal controlling the first switch 511A and/or second switch 511B may be delayed, which in turn may result in a delay in activating/inactivating the output 515. In particular, the first latch 504A of the first circuit includes a data input 502A1 and a clock input 501A1. The data input 502A1 may receive a single-ended signal. In some embodiments, the clock input 501A1 may receive a signal that activates the first latch 504A. In some embodiments, the latch 504A may operate as a delay circuit, for example, when the clock signal 501 is delayed with respect to the received data signal at its input 502 which in turn outputs an enabling signal that closes the first switch 511A so that the LO+ signal can be output, and delayed by a half period from the output 515P. The LO signal 506 at the output can be controlled, but itself is not delayed. Rather, the data signal at the latch output connector 505 which controls the switch 511 can be delayed, resulting in a delayed activation or inactivation of the LO signal at the output 515.

Figure 6:
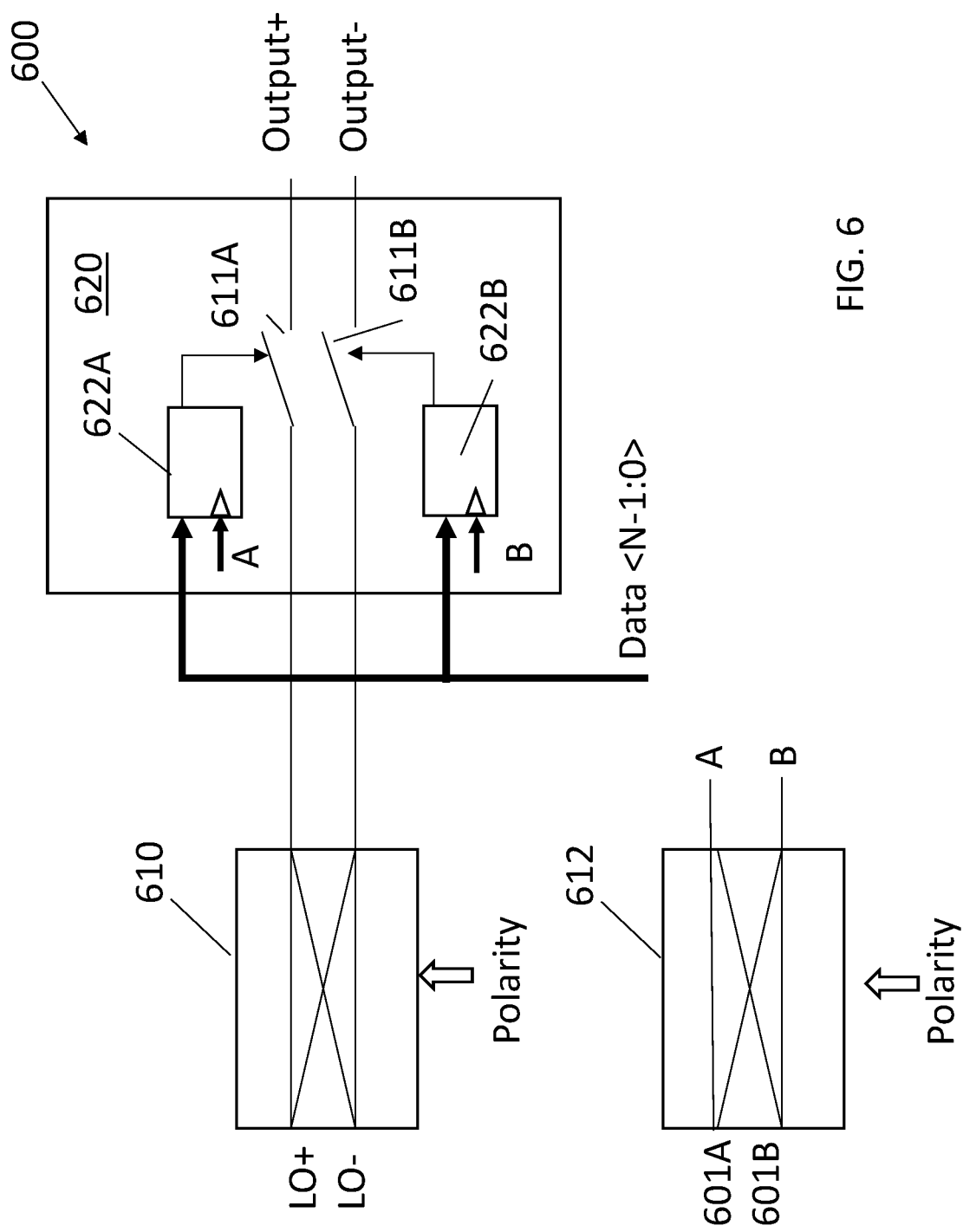
FIG. 6 is a block diagram of an RF-DAC circuit, in accordance with other embodiments.

FIG. 6 is a block diagram of an RF-DAC circuit 600, in accordance with other embodiments. In some embodiments, the RF-DAC circuit 600 may include an LO polarity mixing device 610 and at least one data switch 620. The LO polarity mixing device 610 can operate from a differential input, and permit each of a plurality of differential unit stages to enable or disable the LO+/LO− signals of the differential pair from the single mixing device 610, as distinguished from requiring a polarity mixer in each unit stage of N multiple stages, in configurations that include an array of unit cells.

In some embodiments, the calibration mechanism described in FIG. 3 can be applied to the architecture described in FIG. 6. The signals to the data switches 620 must be processed by a variable delay circuit. In some embodiments, the variable delay circuit may include an analog delay. In other embodiments, the variable delay circuit 610 may include the latches shown and described with reference to FIG. 5. Regardless of configuration, the variable delay circuit 610, also referred to a first polarity switch block, can control whether an additional delay is added to the data signal, depending on the polarity signal. The data switch 620 can include a first switch 611A and a second switch 611B. The data switch 620 can include a first delay circuit 622A that provides a signal or inverse of the signal to the first switch 611A and a second delay circuit 622B that provides a signal or inverse of the signal to the second switch 611B. If the polarity switches from a first polarity state, e.g., + or −, to another polarity state, the delay circuits 622A, 622B open or close the switches 611A, 611B, respectively, to control an output of the data signal, for example, to provide an output shown in FIG. 7. Therefore, since the LO is switched prior to the enabling or disabling of the switches 611, the second polarity switch block 612 receiving the clock signals 601A, 601B can switch the delay signals according to outputs A, B applied to the data, which in turn enables or disables the switches.

As will be appreciated, at least some embodiments include the following embodiments. In one embodiment, a Radio Frequency Digital-to-Analog Converter (RF-DAC) calibration system comprises an actuator circuit comprising a first delay circuit that receives a plurality of data pulses and a second delay circuit that receives the plurality of data pulses, wherein one of the first and second delay circuits delays the data pulses independently of the other of the first and second delay circuits; at least one data switch circuit that receives control signals of the actuator circuit, the control signals including delay data signals of the data pulses from the first and second delay circuits, the at least one data switch further receiving a plurality of Local Oscillator (LO)+ signals and LO− signals, wherein the at least one data switch circuit enables or disables the plurality of LO+ signals and LO− signals for output as a controlled LO signal output from the at least one data switch circuit in response to the control signals; and at least one calibration switch that receives the output of the actuator circuit and the plurality of LO+ and LO− signals, and outputs the controlled LO signal output to a sense circuit. Alternative embodiments of the system may include one of the following features, or any combination thereof.

The at least one data switch circuit may be enabled or disabled depending on a data value of the delay data signals to control an output of the LO+ and LO− signals from the at least one data switch circuit.

At a time of the processing of the plurality of data pulses, the second delay circuit may delay a first control signal of the control signals output by the second delay circuit by a half period relative to an output of a second control signal of the control signals output by the first delay circuit.

The first control signal and the second control signal may shift together.

The control signals may define whether the LO+ signals and LO− signals are output to a power amplifier.

The at least one data switch circuit outputs the LO+ signals and the LO− signals as the controlled LO signal output in response to the delayed data pulses to a power amplifier.

The at least one calibration switch may output the LO+ signals and the LO− signals to the sense circuit in response to the at least one calibration switch operating in communication with the sense circuit in a calibration loop.

The RF-DAC calibration system may further comprise a control unit of the calibration loop. In the calibration loop the at least one calibration switch may output single data pulses created on demand by the control unit. The sense circuit may detects an error by determining if the LO+ signal or a LO− signal received from the at least one calibration switch occurred first, and wherein the control unit adapts a data delay output to the actuator circuit to prevent the error from occurring at the at least one data switch circuit.

The at least one calibration switch may be part of a feedback loop that includes the actuator circuit, the sense circuit, and the control circuit. The control unit may change delays sensed by the sense circuit to remove the glitches at the LO+ or LO− outputs of the data switch in response to an output of the actuator circuit.

The sense circuit receiving the output of the at least one calibration switch may measure a timing relationship between a differential LO signal of the LO+ and LO− signals with a data signal of the data pulses, and senses whether the LO+ signal or LO− signal of the differential LO signal is first at the output of the at least one calibration switch.

The RF-DAC calibration system may further comprise a polarity switch block that switch the delay signals according to outputs applied to the data, which in turn enables or disables the data switch.

In another embodiment, an RF-DAC unit cell comprises a plurality of latch circuits that receive a plurality of data signals, the latch circuits outputting control signals having different delays, in response to the data signals; and at least one switch circuit receives a plurality of Local Oscillator (LO)+ signals and LO− signals and enables or disables the plurality of LO+ signals and LO− signals for output as a controlled LO signal in response to the control signals having different delays Alternative embodiments of the RF-DAC unit cell may include one of the following features, or any combination thereof.

The at least one switch circuit may include a first switch circuit that outputs the LO+ signal as the controlled LO signal at a first output of the unit cell and a second switch circuit that outputs the LO− signal as the controlled LO signal at a second output of the RF-DAC unit cell.

The first switch circuit may include a first switch and a second switch controlled by a first latch and a second latch, respectively, to propagate the LO+ signal according to a controlled delay to the first output, and the second switch circuit may include a first switch and a second switch controlled by a first latch and a second latch, respectively, to propagate the LO− signal according to a controlled delay to the second output.

The first and second latches coupled to the first switch circuit may each include a clock input, at least one of the clock inputs configured to provide delayed timing signals with respect to a corresponding data signal of the data signals. The first and second latches coupled to the second switch circuit may each include a clock input. At least one of the clock inputs may be configured to provide delayed timing signals with respect to a corresponding data signal of the data signals.

A control signal may be applied to the second switch of the first switch circuit and a control signal may be applied to the second switch of the second switch circuit, and may place at least one of the first switch circuit or the second switch circuit in a transparent mode to delay the propagation of the LO− signal as the controlled LO signal.

The LO+ signal may be delayed by a half period from the first output of the unit cell relative to the LO− signal at the second output.

In another embodiment, an RF-DAC circuit comprises a local oscillator (LO) polarity mixing device that receives a differential pair of LO signals; and at least one data switch circuit that controls an output of a LO+ signal and a LO− signal of the differential pair independently of each other in response to control signals of a data input having different delays, wherein the LO polarity mixing device permits each of a plurality of differential unit stages to enable or disable the LO+ signal and the LO signal of the differential pair.

Alternative embodiments of the RF-DAC circuit may include one of the following features, or any combination thereof.

The RF-DAC circuit may further comprise a polarity switch block that receives clock signals to switch the data input having different delays according to outputs of the polarity switch block, which in turn enables or disables first or second data switches.

The at least one data switch circuit may comprise a first delay circuit that generates a first control signal of the control signals of the data input according to a first output of the outputs of the polarity switch block; a second delay circuit that generates a second control signal of the control signals of the data input according to a second output of the outputs of the polarity switch block; a first switch that outputs the LO+ signal in response to the first control signal; and a second switch that outputs the LO+ signal in response to the second control signal.

In some embodiments, a system may include a sense system that only senses the timing relations involved in a RF-DAC operation, a calibration loop that determines based on the results of the sense system how the delays need to be modified, and an actuator system that generates the required delays.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Radio Frequency Digital-to-Analog Converter (RF-DAC) calibration system, comprising:
    an actuator circuit comprising a first delay circuit that receives a plurality of data pulses and a second delay circuit that receives the plurality of data pulses, wherein one of the first and second delay circuits delays the data pulses independently of the other of the first and second delay circuits;
    at least one data switch circuit that receives control signals of the actuator circuit, the control signals including delay data signals of the data pulses from the first and second delay circuits, the at least one data switch circuit further receiving a plurality of Local Oscillator (LO)+ signals and LO− signals, wherein the at least one data switch circuit enables or disables the plurality of LO+ signals and LO− signals for output as a first controlled LO signal output from the at least one data switch circuit in response to the control signals, wherein the at least one data switch circuit outputs the LO+ signals and the LO− signals as the first controlled LO signal output to a power amplifier;
    at least one calibration switch that receives the output of the actuator circuit and the plurality of LO+ and LO− signals, and outputs a second controlled LO signal output to a sense circuit; and
    a control unit of a calibration loop, wherein the sense circuit detects an error by determining whether the LO+ signal received from the at least one calibration switch occurred before the LO− signal received from the at least one calibration switch, and wherein the control unit adapts a data delay output to the actuator circuit to prevent the error from occurring at the at least one data switch circuit.

2. The RF-DAC calibration system of claim 1, wherein the at least one data switch circuit is enabled or disabled to generate the controlled LO signal output depending on a data value of the delay data signals to control an output of the LO+ and LO− signals from the at least one data switch circuit.

3. The RF-DAC calibration system of claim 1, wherein at a time of the processing of the plurality of data pulses, the second delay circuit delays a first control signal of the control signals output by the second delay circuit by a half period relative to an output of a second control signal of the control signals output by the first delay circuit.

4. The RF-DAC calibration system of claim 3, wherein the first control signal and the second control signal shift together.

5. The RF-DAC calibration system of claim 3, wherein the control signals define whether the LO+ signals and LO− signals are output to a power amplifier.

6. The RF-DAC calibration system of claim 1, wherein the at least one calibration switch outputs the LO+ signals and the LO− signals to the sense circuit in response to the at least one calibration switch operating in communication with the sense circuit in a calibration loop.

7. The RF-DAC calibration system of claim 1, wherein the at least one calibration switch is part of a feedback loop that includes the actuator circuit, the sense circuit, and the control circuit, and wherein the control unit changes delays sensed by the sense circuit to remove the error at the LO+ or LO− outputs of the at least one data switch circuit in response to an output of the actuator circuit.

8. The RF-DAC calibration system of claim 1, wherein the sense circuit receiving the output of the at least one calibration switch measures a timing relationship between the second controlled LO signal output with a data signal of the data pulses, and senses whether the LO+ signal or LO− signal of the second controlled LO signal output is received first by the sense circuit.

9. The RF-DAC calibration system of claim 1, further comprising a polarity switch block number that switches the delay signals according to outputs applied to the data, which in turn enables or disables the at least one data switch circuit.

10. A Radio Frequency Digital-to-Analog Converter (RF-DAC) unit cell, comprising:
    a plurality of latch circuits that receive a plurality of data signals, the latch circuits outputting control signals having different delays, in response to the data signals;
    at least one switch circuit that receives a plurality of Local Oscillator (LO)+ signals and LO− signals and enables or disables the plurality of LO+ signals and LO− signals for output as a controlled LO signal in response to the control signals having different delays;
    a sense circuit that receives the controlled LO signal from the at least one switch circuit and determines whether the LO+ signal is received from the at least one switch circuit before the LO− signal is received from the at least one switch circuit; and
    a control unit that adapts a data delay output to the plurality of latch circuits to prevent the LO+ signal from being received before the LO− signal is received at the plurality of latch circuits.

11. The RF-DAC unit cell of claim 10, wherein the at least one switch circuit includes a first switch circuit that outputs the LO+ signal as the controlled LO signal at a first output of the unit cell and a second switch circuit that outputs the LO− signal as the controlled LO signal at a second output of the RF-DAC unit cell.

12. The RF-DAC unit cell of claim 11, wherein the first switch circuit includes a first switch and a second switch controlled by a first latch and a second latch, respectively, to propagate the LO+ signal according to a controlled delay to the first output, and the second switch circuit includes a first switch and a second switch controlled by a first latch and a second latch, respectively, to propagate the LO− signal according to a controlled delay to the second output.

13. The RF-DAC unit cell of claim 12, wherein the first and second latches coupled to the first switch circuit each includes a clock input, at least one of the clock inputs configured to provide delayed timing signals with respect to a corresponding data signal of the data signals, wherein the first and second latches coupled to the second switch circuit each includes a clock input, and wherein at least one of the clock inputs is configured to provide delayed timing signals with respect to a corresponding data signal of the data signals.

14. The RF-DAC unit cell of claim 12, wherein a control signal applied to the second switch of the first switch circuit and a control signal applied to the second switch of the second switch circuit place at least one of the first switch circuit or the second switch circuit in a transparent mode to delay the propagation of the LO− signal as the controlled LO signal.

15. The RF-DAC unit cell of claim 10, wherein the LO+ signal is delayed by a half period from the first output of the unit cell relative to the LO− signal at the second output.

* * * * *